(12) United States Patent
Sherry et al.

(10) Patent No.: US 11,307,232 B1
(45) Date of Patent: Apr. 19, 2022

(54) WAVEGUIDE INTEGRATED CIRCUIT TESTING

(71) Applicant: Johnstech International Corporation, Minneapolis, MN (US)

(72) Inventors: Jeffrey Sherry, Savage, MN (US); Cory Kostuchowski, Wyoming, MN (US)

(73) Assignee: Johnstech International Corporation, Minneapolis, MN (US)

( * ) Notice: Subject to any disclaimer, the term of this patent is extended or adjusted under 35 U.S.C. 154(b) by 169 days.

(21) Appl. No.: 16/796,517

(22) Filed: Feb. 20, 2020

Related U.S. Application Data

(60) Provisional application No. 62/810,652, filed on Feb. 26, 2019.

(51) Int. Cl.
| | |
|---|---|
| *G01R 29/08* | (2006.01) |
| *G01R 1/067* | (2006.01) |
| *G01R 1/073* | (2006.01) |
| *G01R 31/28* | (2006.01) |
| *G01N 21/35* | (2014.01) |
| *G01R 1/04* | (2006.01) |

(52) U.S. Cl.
CPC ......... *G01R 29/0878* (2013.01); *G01R 1/045* (2013.01); *G01R 1/06772* (2013.01)

(58) Field of Classification Search
CPC .... G01R 29/08; G01R 29/0878; G01R 1/045; G01R 1/067; G01R 1/073; G01R 1/06772; G01R 31/28; G01N 21/35
See application file for complete search history.

(56) References Cited

U.S. PATENT DOCUMENTS

2015/0102225 A1* 4/2015 Sertel ................. G01R 31/2822
                                                            250/341.5

FOREIGN PATENT DOCUMENTS

CN            113132052         *  7/2021  ............... H04K 3/00

* cited by examiner

*Primary Examiner* — Neel D Shah
(74) *Attorney, Agent, or Firm* — Hamre, Schumann, Mueller & Larson, P.C.

(57) ABSTRACT

A structure and method for providing a housing which includes a high frequency (HF or RF) connection between a device under test (DUT) having a waveguide 22. The waveguide includes a wave insert 22, and a conductive compliant member 40 which maintains bias between the adapter/insert 22 and the DUT HF port 20 while also maintaining an RF shield despite the variable height of the DUT waveport. A passage 50 provides an RF connection between the RF port 62 on the DUT and a RF wave guide horn 54. A plurality of transmitting horns 54 can be arranged to transmit to a single receiving horn 154 so that fewer receivers are required to test multiple DUTs in sequence.

19 Claims, 26 Drawing Sheets

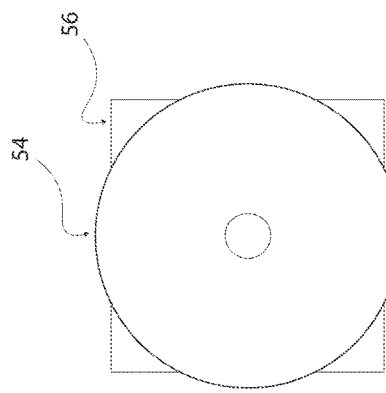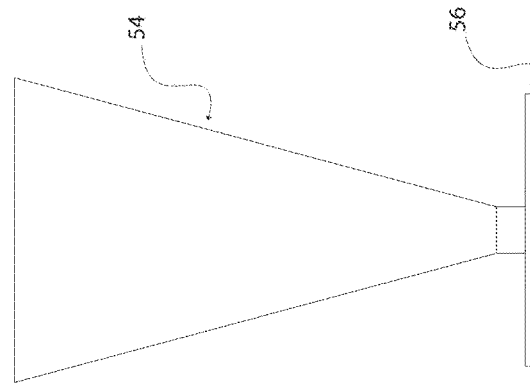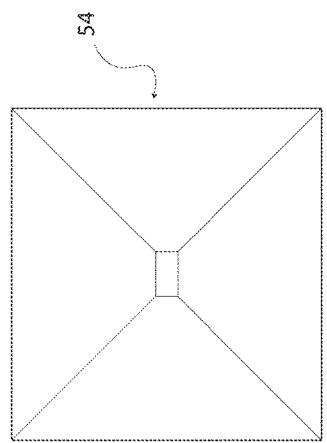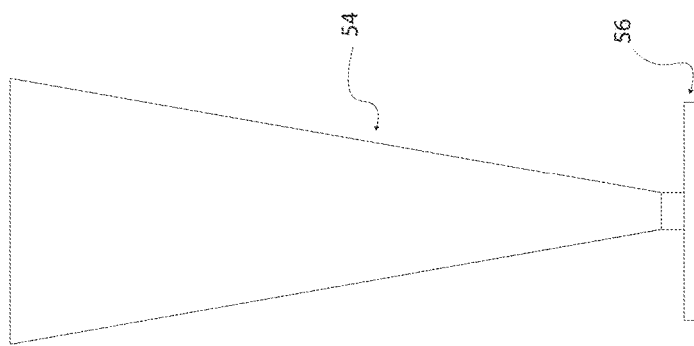

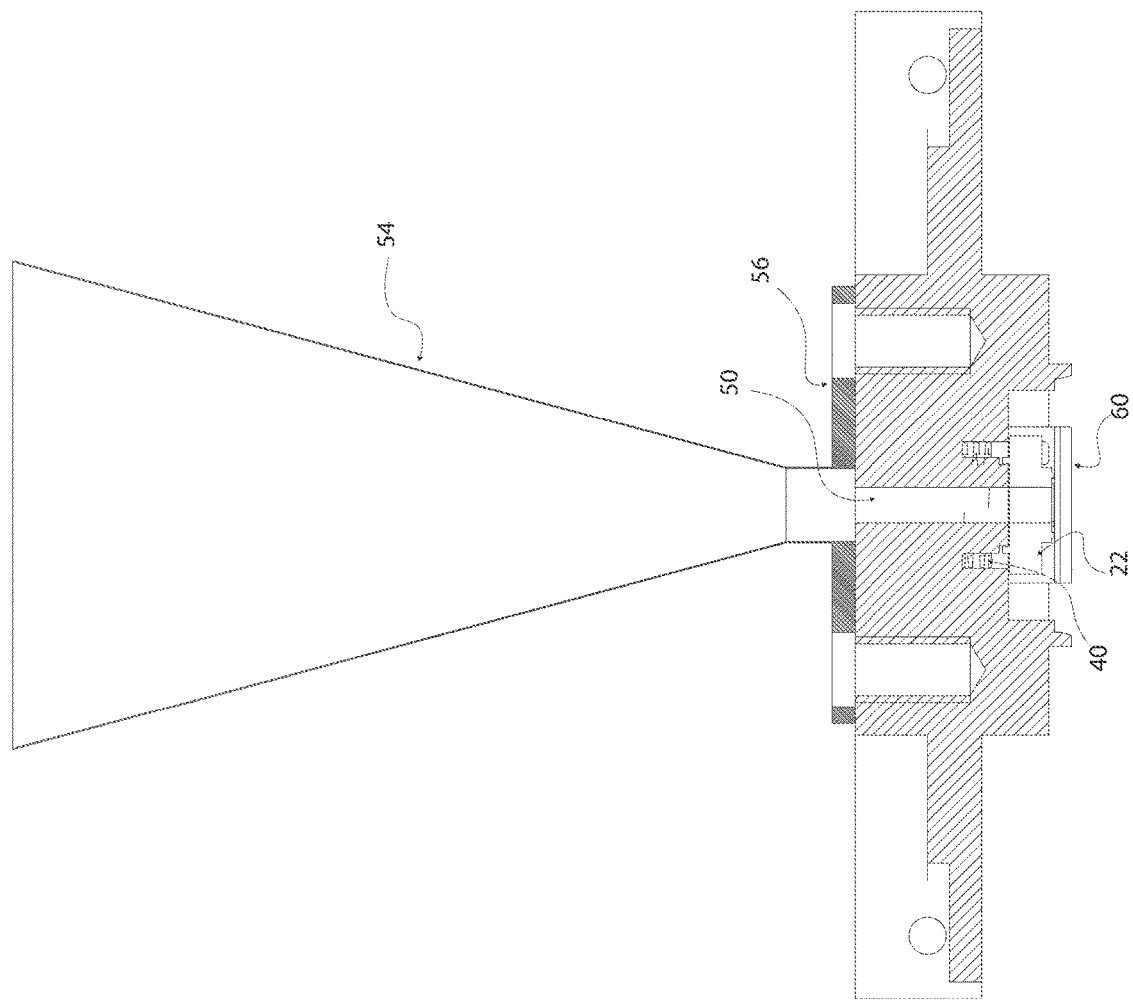

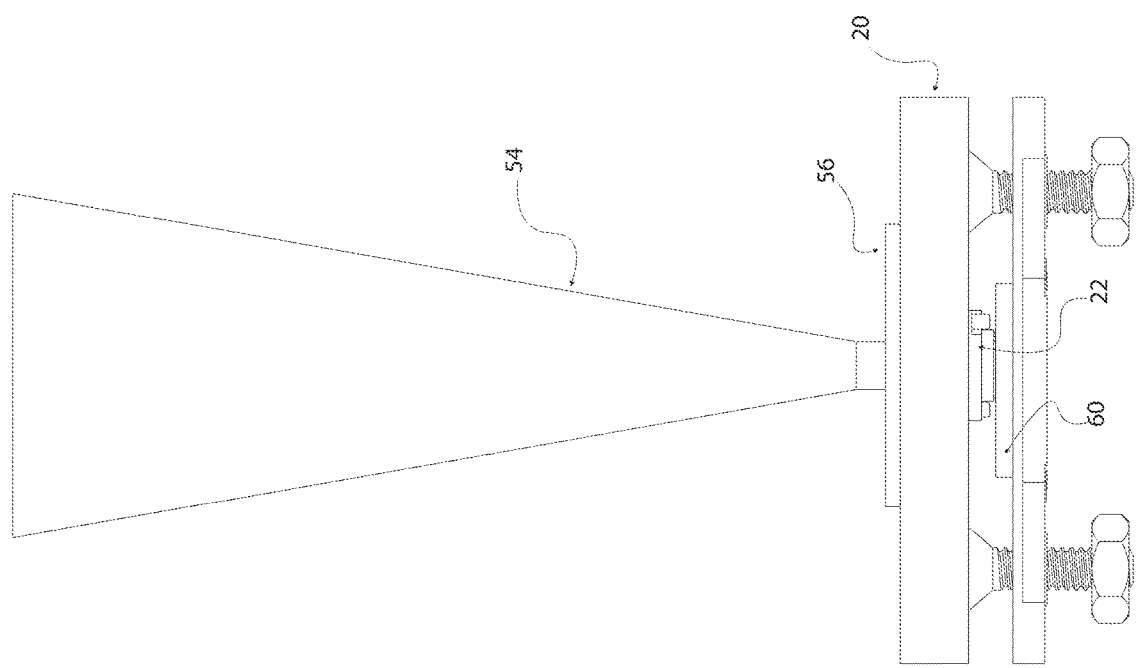

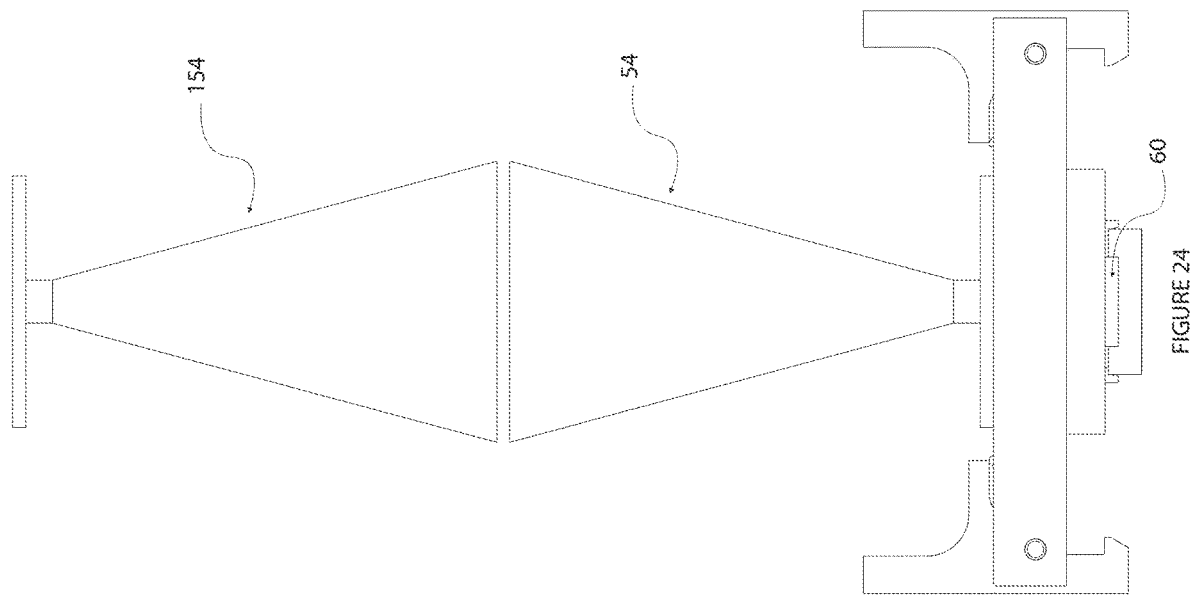

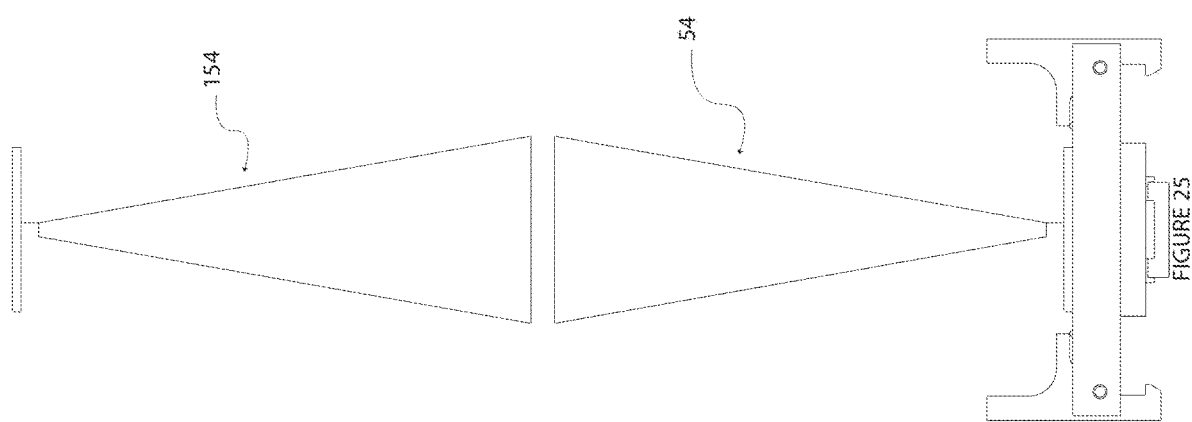

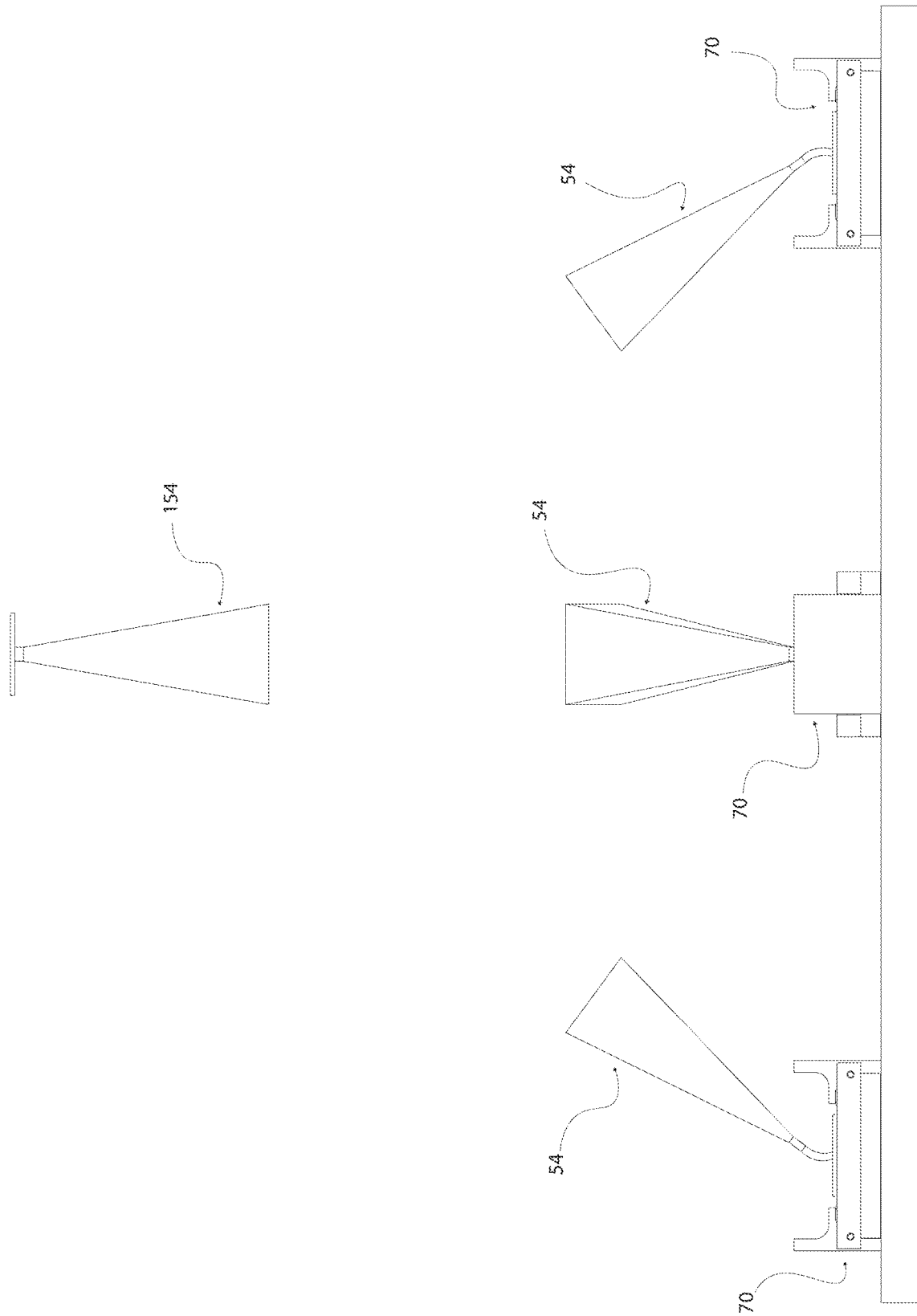

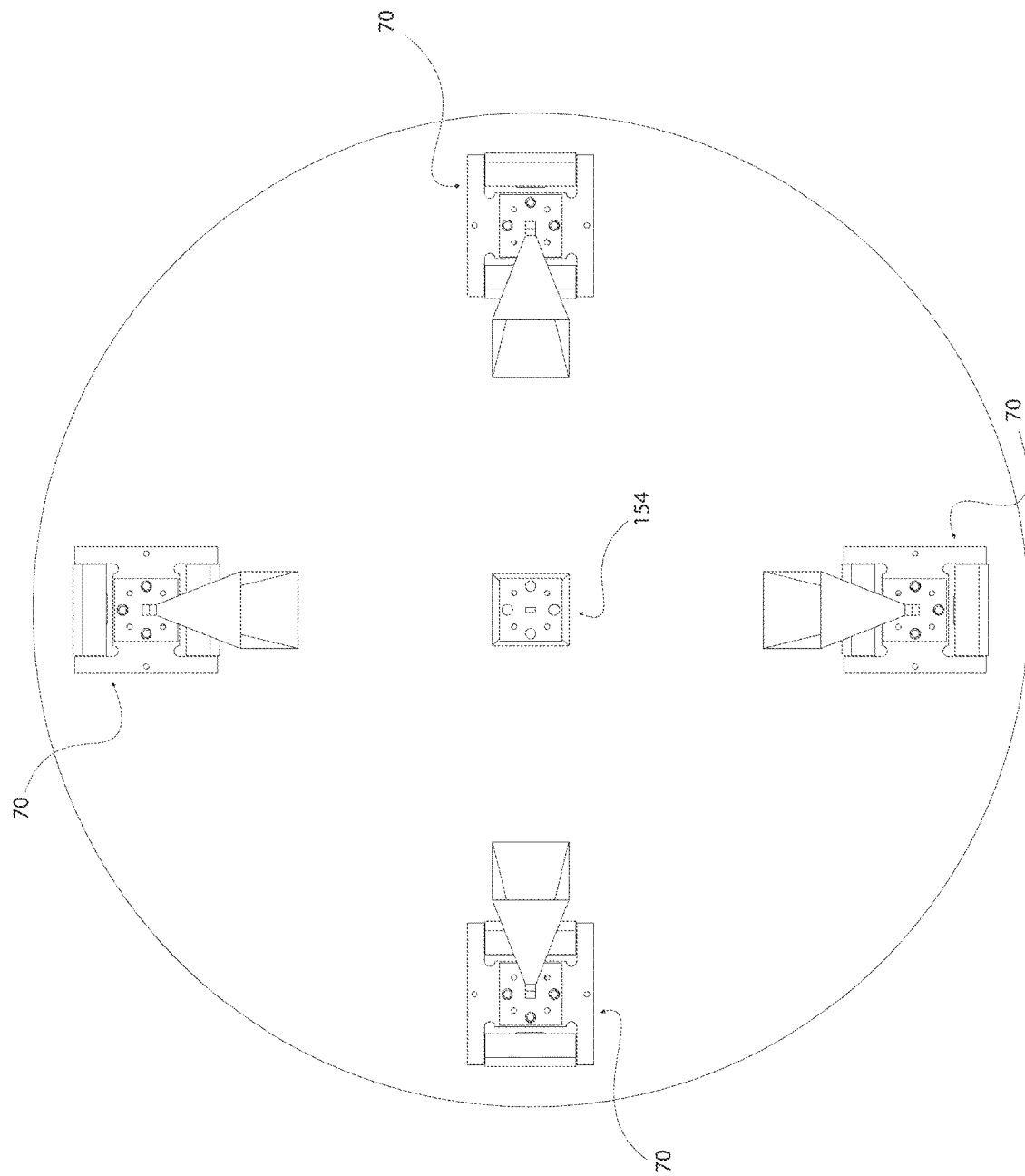

WAVEGUIDE INTEGRATED CIRCUIT TESTING

BACKGROUND

Field of the Disclosure

The present disclosure is directed to equipment for testing integrated circuits and semiconductors.

CROSS REFERENCE AND INCORPORATION BY REFERENCE

Priority is claimed from the following application which is also hereby incorporated by reference in their entirety: U.S. Pat. No. 10,274,515 application Ser. No. 15/228,355 filed 4 Aug. 2016 entitled Waveguide Integrated Testing and U.S. provisional application 62/810,0652 filed 26 Feb. 2010 of same title.

Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in circuits which run at high frequencies. Prior art test systems cannot handle these frequencies reliably or without signal losses. Furthermore, shielding of high frequency (HF) ports prevents interference with adjacent ports. With HF ICs testing is especially problematic if the RF ports are located on the bottom side of the IC, i.e. where the pads/balls are located. This is because access to the bottom side is largely occluded by the test housing and load board on which the housing resides. In addition, because some RF ICs have many different RF emitters, it can difficult, slow or impossible to provide proper RF coupling to test all of the RF emitters. There simply isn't enough room to provide pickup receivers close enough to the emitters. The disclosure addresses these issues and others.

BRIEF SUMMARY

The summary below is not intended to define the scope of invention but provide a convenient way for the reader to understand some of the concepts in the entire document.

There is disclosed a test socket for making electrical connection between an integrated circuit device under test (DUT) having a high frequency (HF) wave port located on the DUT at a height above the surface of the DUT, and a plurality of contact points on the surface of the DUT, comprising any or all of the following elements each to be interpreted as broadly as possible:
a housing having a top wave port adapter portion and wave port adapter, said wave port insert portion being in up and down sliding engagement with the housing and the DUT wave port and having a bottom surface sized to engage a recess in said bottom so that the top and bottom overlap during up and down movement therebetween, said housing being configured to bring said wave port insert portion into proximate contact with said DUT wave port;
said adapter portion including a HF shielding elastomeric biasing compliance member positioned to bias said insert portion resiliently into said port on the DUT, so that when the housing is brought adjacent the DUT, contact is made with the plurality of contact points on the DUT and the insert portion makes biased contact with the DUT wave port, despite variations in the height of the wave port above the surface of the DUT.

Also disclosed is wherein the elastomeric bias compliance member is a resilient metal spring.

Also disclosed is wherein the elastomeric bias compliance member is a resilient metal coated spring.

Also disclosed is wherein the elastomeric bias compliance member is a resilient helical wound conductive spring.

Also disclosed is wherein the elastomeric bias compliance member is a resilient a spring formed into a double helix and electrically conductive.

Also disclosed is wherein the insert adapter includes a circumferential recess for receiving a portion of said compliance member.

Also disclosed is wherein the housing includes a circumferential recess for receiving a portion of said compliance member.

Also disclosed is wherein the insert adapter includes a coaxial shield member located on a surface of said adapter facing said DUT and coaxially with said compliance member; said shield joining said DUT and adapter when the two are brought together.

Also disclosed is wherein said compliance member is a cylindrical conductive elastomeric tube.

Also disclosed is wherein the wave port on the DUT has an inner periphery and wherein said insert adapter extends into said inner periphery.

Also disclosed is wherein said adapter includes a plurality of apertures and the housing includes dowel pins sized to be slideably received within said apertures, whereby the inert adapter may move along said dowel pins in response to contact with the DUT wave port.

Also disclosed is wherein said compliant member includes a plurality of stacked non planar resilient rings.

Also disclosed is wherein the compliant member includes a plurality so spring pins extending from aligned side by side into a circumferential resiliently supporting the adapter.

Also disclosed is wherein said compliance member is a cylindrical conductive elastomeric tube having a bottom edge and a conductive circular washer joined thereto to create a base to said tube.

Also disclosed is a method of maintaining a RF shielding path between a DUT and test housing device, where the housing is capable of up and down movement in response to inserting of the DUT into the housing, comprising any or all of the steps below in any order:
forming a two-part housing of an upper adapter part and a lower waveguide part, the upper part configured to engage a port on the DUT at its top end and slideably engage the waveguide at its lower end, while maintaining an RF shielded path during sliding; inserting an elastomeric conductive compliant member within said waveguide and up into the adapter to bias the upper part into said DUT port.

Also disclosed is a test socket, attachable to a load board, for making electrical connection between an integrated circuit device under test (DUT) having connection points and a high frequency (HF) wave port, comprising any or all of the following elements interpreted broadly:
a housing having a top adapter portion and bottom guide portions, said top portion being in up and down sliding engagement with DUT wave port and having a bottom surface sized to engage a recess in said bottom so that the top and bottom overlap during up and down movement therebetween, said bottom part having a circumferential recess;
a shielding elastomeric bias element received partly within said recess and partly within said top portion to provide a continuous shield between the top and bottom portion and for simultaneously biasing the top portion against said DUT;
a calibration dummy DUT sized to be received in place of said DUT and including a high frequency source input port and a dummy output port configured to be aligned with said high frequency port, so that a known a HF signal of known parameters can be inputted through said input port and a signal parameter measurement can be made at said load board, thereby providing a calibration signal.

This summary is provided to assist the reader obtaining a quick overview of some key elements of the disclosure.

There is disclosed a system for testing multiple integrated circuit devices under test (DUT) having a radio high frequency (RF) wave port located on the DUT, comprising:
 a. an array of test housings each having a receiver for a DUT, said housing being arranged around a central axis;
 b. each housing being associated with an RF transmitting horn antenna having narrow proximal central aperture and a wide distal aperture and defining a transmitter horn axis therebetween;
 c. a curved hollow link element having a first end located proximate said RF wave port and a second end
 d. a receiving RF horn antenna located generally above said array and proximate said central axis;
 e. said RF transmitting horn antennas being oriented so that the horn axis generally points to said receiving horn where the transmitting axis intersects said central axis.

There is also disclosed a method of testing a plurality of radio frequency transmitting devices under test (DUT), each DUT having a RF output port, comprising the steps of:
 a. locating a plurality of DUTs in an array with each RF output port being oriented in the same direction;
 b. locating a transmitting RF waveguide horn proximate the DUT output port on DUT;
 c. locating a receiving wave guide horn proximate the array but spaced therefrom and generally central to the array;
 d. pointing the transmitting RF waveguide horns in the array at an angle toward the receiving horn;
 e. sequentially testing each of DUTs in the array and sequentially receiving RF signals from each of said DUTs at said receiving horn.

The disclosure also includes a system wherein said DUT has a RF port having a port central axis and wherein said central aperture on said horn antenna is coaxially aligned with said port central axis.

The disclosure also includes a system wherein a waveguide insert supported by a compliant elastic member, said insert being interposed between said DUT RF port and said horn antenna which thereby causes the insert to minimizes RF leakage between the DUT RF port and antenna. The waveguide adapter/insert is configured to extend part way into the housing and be able to translate vertically along guidepins to adapt and file spaced between the DUT RF port and the RF transmitting horn to prevent RF crosstalk and leakage.

The disclosure also includes a system wherein the elastic member is at least partially recessed with said housing.

The disclosure also includes a system wherein the housing includes a groove sized to receive a portion of said elastic member.

The disclosure also includes a system wherein the DUT, housing and transmitting antenna are enclosed in an environmentally controlled enclosure.

The disclosure also includes a system wherein at least one receiving antenna and wherein said receiving antenna is located outside said enclosure.

The disclosure also includes a system wherein at least one receiving antenna and wherein said receiving antenna is located generally along said central axis spaced from said transmitting antenna.

The disclosure also includes a system wherein the transmitting antenna includes a plurality of transmitting antennas, one associated with each DUT and wherein each transmitting antenna is pointed to said receiving antenna.

The disclosure also includes a system wherein said receiving antenna sequentially tests a plurality of DUTs.

The disclosure also includes a system wherein the transmitting antennas are each angled toward said receiving antenna.

The disclosure also includes a system wherein said interface adapter is biased against said RF port.

The disclosure also includes a system wherein said interface adapter includes vertical pins and is configured to move along said pins.

The disclosure also includes a system for testing multiple integrated circuit devices under test (DUT) having a radio high frequency (RF) wave port located on the DUT, comprising:
 a. an array of test housings each having a receiver for a DUT, said housing being arranged around a central axis;
 b. each housing being associated with a RF transmitting horn antenna having proximal central aperture and a wider distal aperture and defining a transmitter horn axis therebetween;
 c. a circumferential adapter element size to surround said DUT RF port having a first end located proximate said RF wave port and having a bias element to maintain engagement between said RF port and said adapter;

d. a receiving RF horn antenna located generally above said array and proximate said central axis and said adapter;

e. said RF transmitting horn antennas being oriented so that the horn axis generally points to said receiving horn where the transmitting axis intersects said central axis.

The disclosure also includes a system for testing a plurality of radio frequency transmitting devices under test (DUT), each DUT having a RF output port, comprising the steps of:

a. locating a plurality of DUTs in an array with each RF output port being oriented in the same direction;

b. locating a transmitting RF waveguide horn proximate the DUT output port on DUT;

c. locating a receiving wave guide horn proximate the array but spaced therefrom and generally central to the array;

d. pointing the transmitting RF waveguide horns in the array at an angle toward the receiving horn;

e. sequentially testing each of DUTs in the array and sequentially receiving RF signals from each of said DUTs at said receiving horn.

The disclosure also includes a method further including the step of pointing each of said horns toward said receiving horn.

The disclosure also includes a method further including locating an adapter element between said RF port and said RF waveguide to create an RF shield therebetween.

The disclosure also includes a method further including locating an elastomeric bias member adjacent the adapter element to maintain said element in contact with said RF waveguide and minimize RF crosstalk.

The disclosure also includes a method further including the step of locating the DUT and wave guide horn within an environmentally enclosed chamber and locating said receiving horn outside said chamber.

Other features are disclosed herein.

BRIEF DESCRIPTION OF THE SEVERAL VIEWS OF THE DRAWINGS

FIG. 18 is a top plan view of a rectangular wave guide.

FIG. 19 is a side plan view of FIG. 18.

FIG. 20 is a top plan view of a circular/conical wave guide.

FIG. 21 is a side plan view of FIG. 20.

FIG. 22 is a side sectional view of FIG. 19.

FIG. 23 is a side plan view of FIG. 22 with mounting plate and bolts.

FIG. 24 is a side plan view like FIG. 23 with a manual actuator and a wave guide receiver.

FIG. 25 is a view like FIG. 24 with an elongated pair of wave guides.

FIG. 28 is a side plan view of FIG. 27.

FIG. 29 is a top plan view of FIG. 27.

DETAILED DESCRIPTION

Integrated circuits operate at different speeds. Some devices which operate at 60+ GHz need to be tested and conventional test systems that use coax, contacts or microstrip or stripline structures to interface to devices under test are extremely lossy at these frequencies. Examples of such devices are chips which have microwave/radar transceivers, such as for automotive auto braking systems. The present disclosure provides a waveguide interface to these devices which can provide a high frequency interface to these devices, may still not be able to provide compliance/solid contact to the chip while still providing a solid RF return path for production testing when accounting for package tolerancing.

In this disclosure a waveguide is shown with properties to interface to these devices by adding compliance/resilience to the housing as shown in detail in U.S. patent application Ser. No. 15/228,355 filed 4 Aug. 2016 entitled Waveguide Integrated Testing which is incorporated herein by reference.

Figure 16:
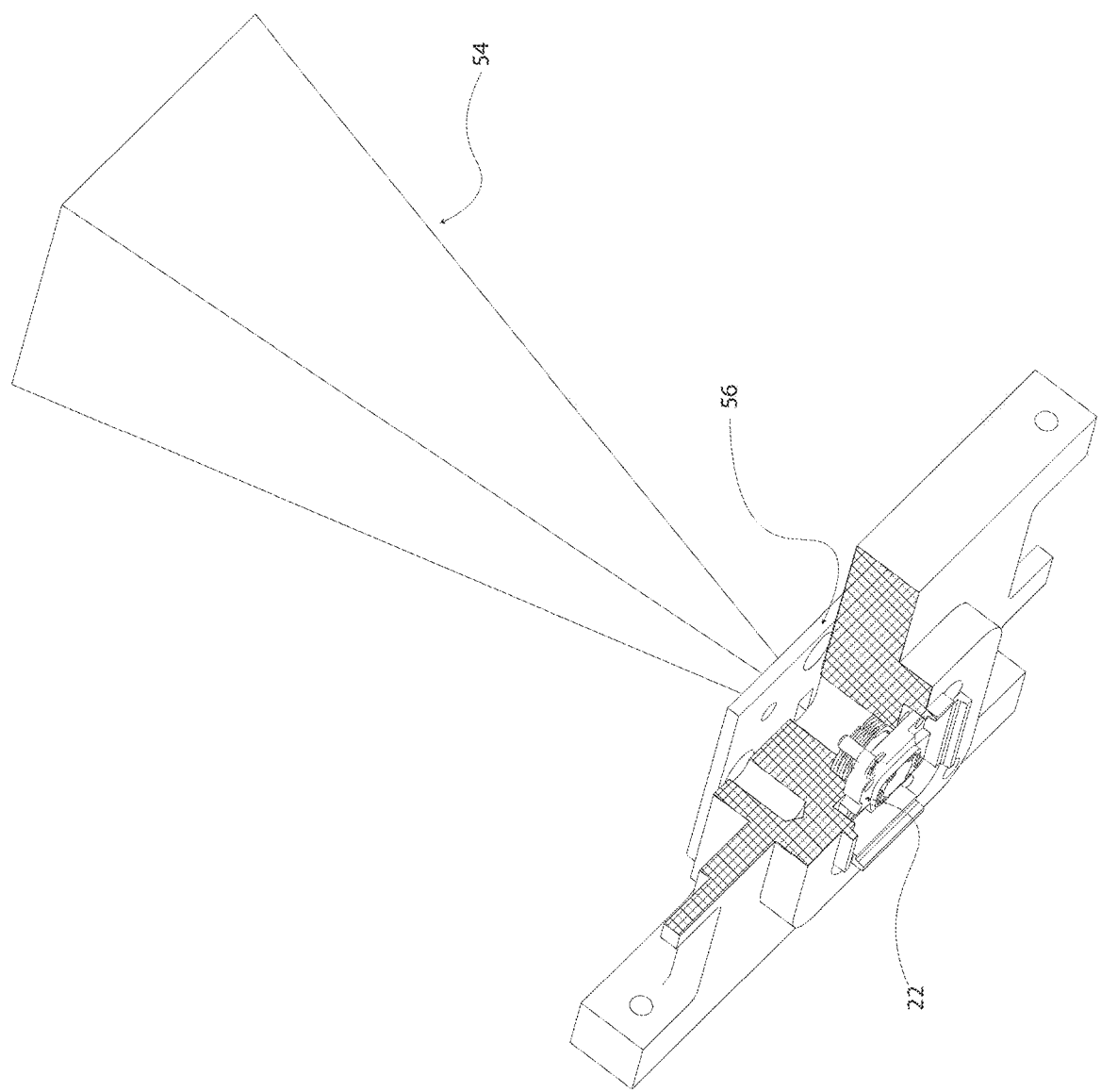
FIG. 16 is a view like FIG. 14 with a rectangular waveguide.
Figure 17:
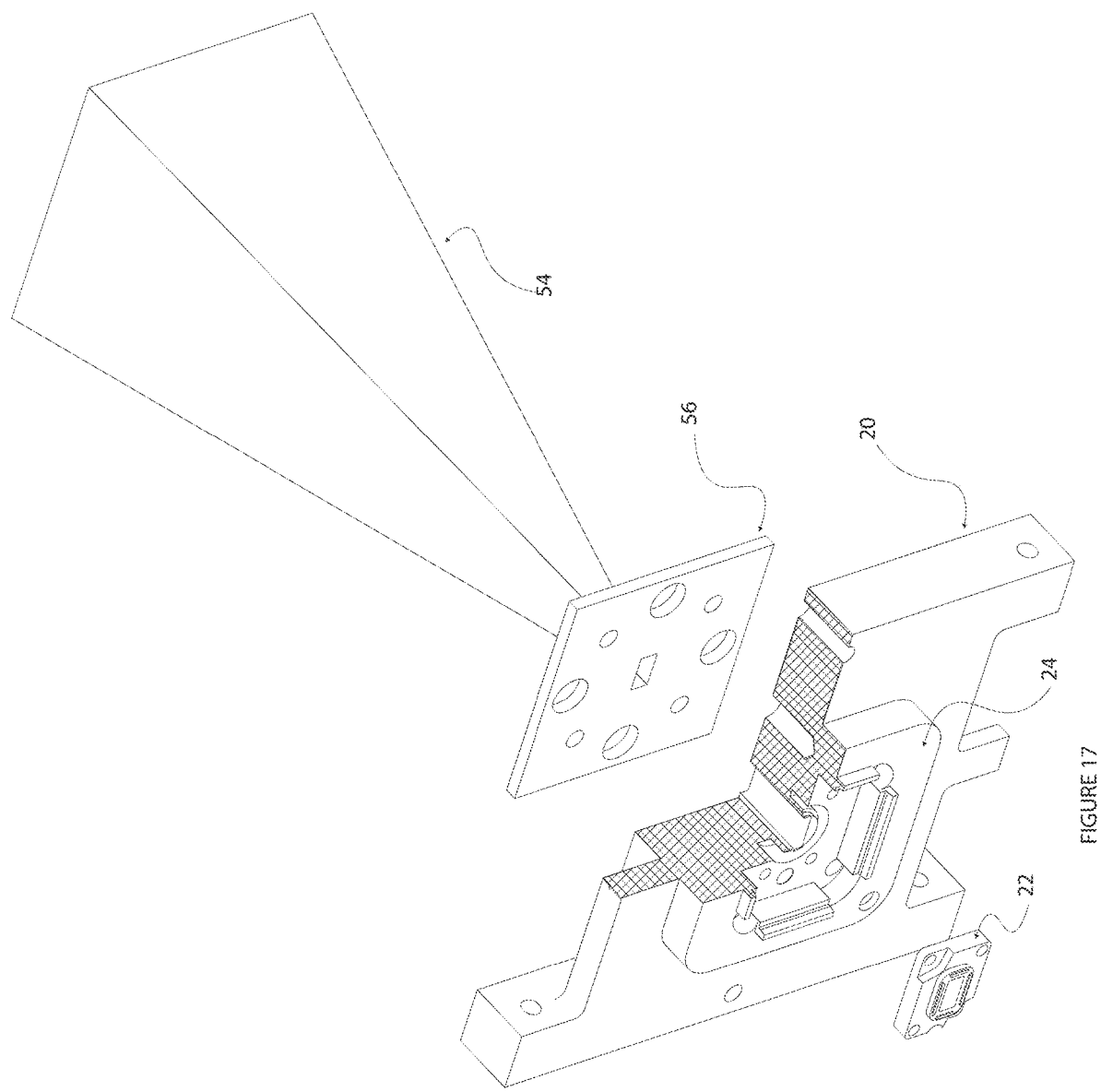
FIG. 17 is an exploded view of FIG. 16.
Figure 26:
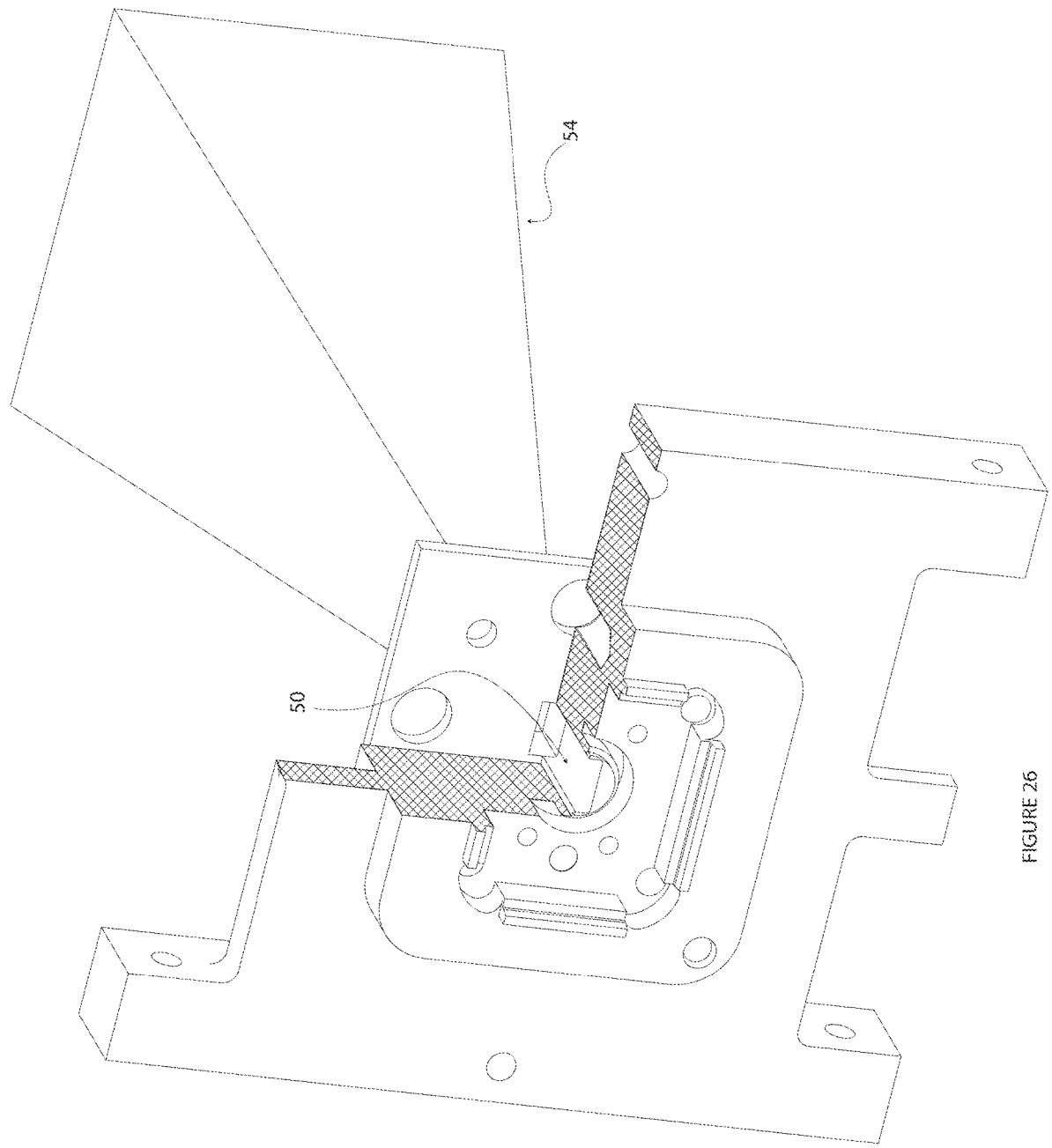
FIG. 26 is a view like FIG. 17 with a waveguide attached.

FIGS. 1-5 illustrate an assembly 10 with compliance and manual actuation. A receiver 24 is situated on the actuator body 20. A waveguide insert/interface adapter/link 22 is supported by a compliant elastic member/spring 40 (also visible in FIGS. 16 and 22) which allows the insert to be compliant to insertion forces when a handler inserts a device under test (not shown) into the insert and it assists in preventing RF leakage or crosstalk between the DUT and the antenna. The adapter may translate vertically along pins 23 in holes 25 (FIG. 1) in response to spring 40.

Springs 44 via pivot pins 36 and handles 46 are used to manually actuate the position of the body 20 during test. Handles 46 have latch hooks 48 to engage with another board. As shown in FIG. 22 the spring 40 is at least partially recessed with said housing and the housing includes an annular groove sized 27 to receive a portion of said elastic member. The insert adapter may also be recessed into the housing so that when it translates along the pins, it will still provide an RF shield because of overlapping parts.

FIGS. 6-26 illustrate various configurations of a compliant waveguide and a structure focusing the RF emitted signal from the DUT to a receiver for testing its output.

Figure 6:
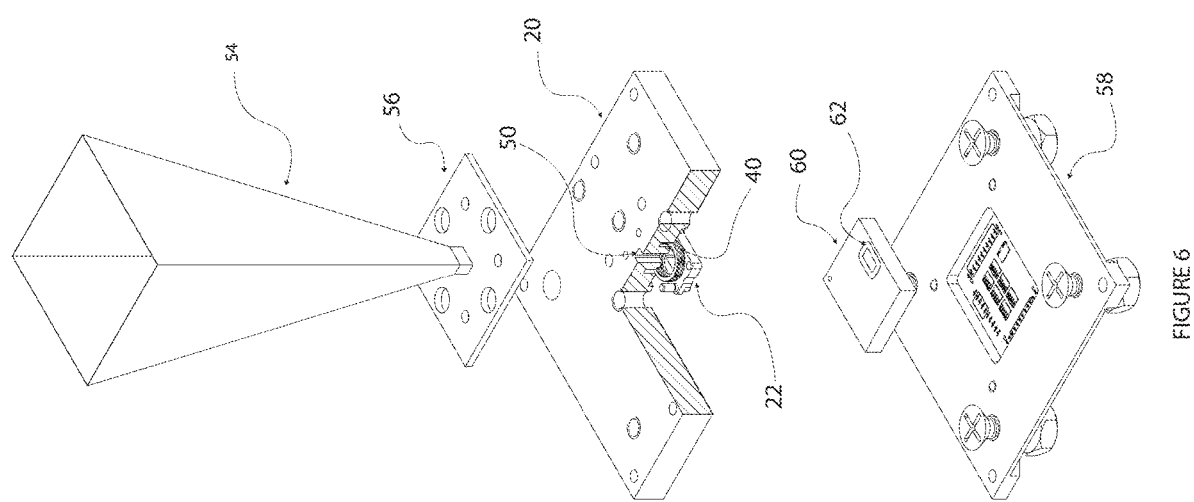
FIG. 6 is a top perspective exploded view of a wave guide housing system wave guide aligned with the RF port of the IC.
Figure 7:
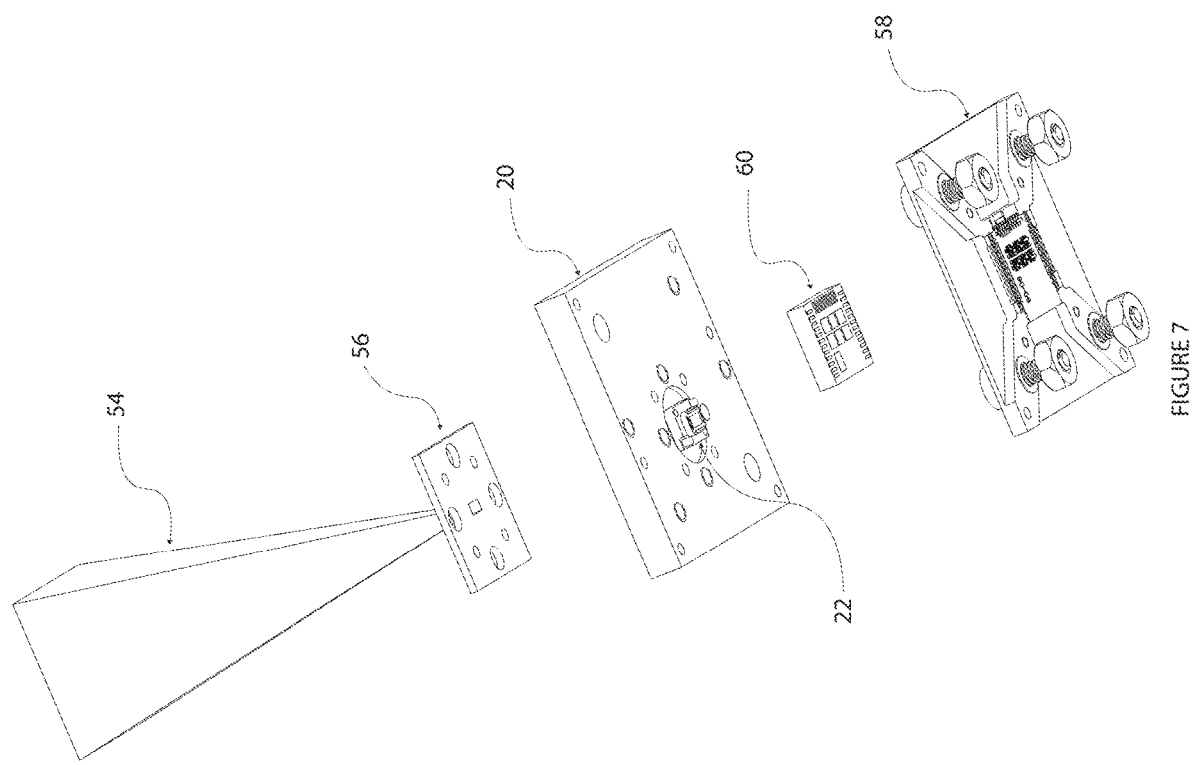
FIG. 7 is a bottom exploded view of FIG. 6.
Figure 8:
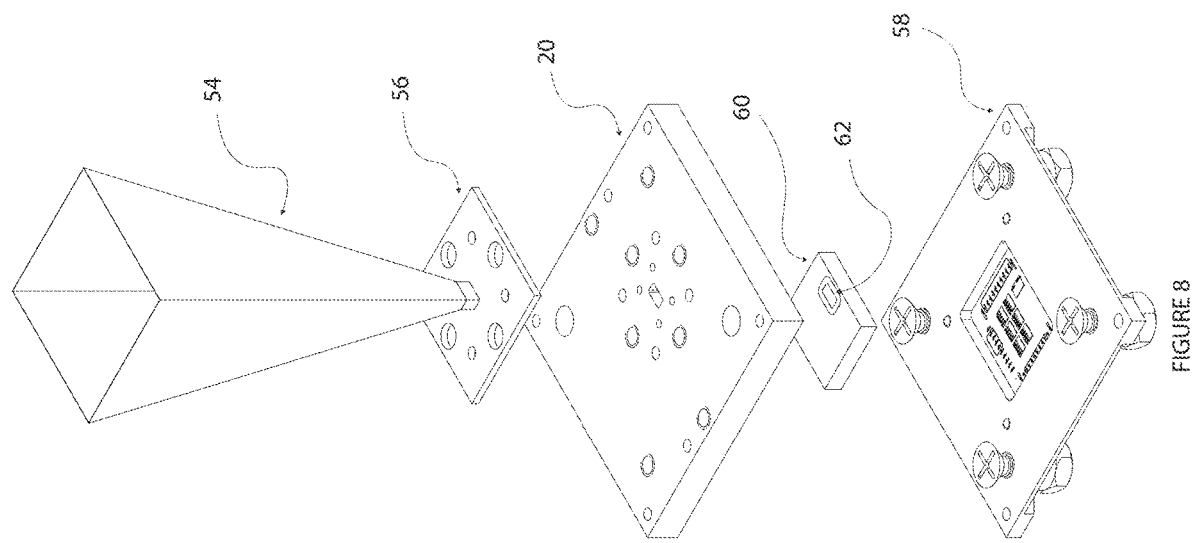
FIG. 8 is a view like FIG. 6 without portions broken away.

FIG. 6 illustrates a compliant housing with a device under test (DUT) 60 having a bottom surface RF output port 62, a waveguide adapter/insert 22, and an aperture 50 in the bottom plate/body 20 which aligned with a horn antenna/RF guide 54. The DUT makes electrical contact with the contactor housing 58 which is in turn connected to a load board, not shown.

The horn antenna is mounted to the body 20 by a plate/flange 56 which is proximate the DUT port element which transmits RF, and maintains the coaxial alignment of the horn with the RF output port 62 of the DUT 60.

In this embodiment, the horn is tapered from a narrow rectangular opening generally the size of the DUT output port to a larger opening at its distal end.

Figure 9:
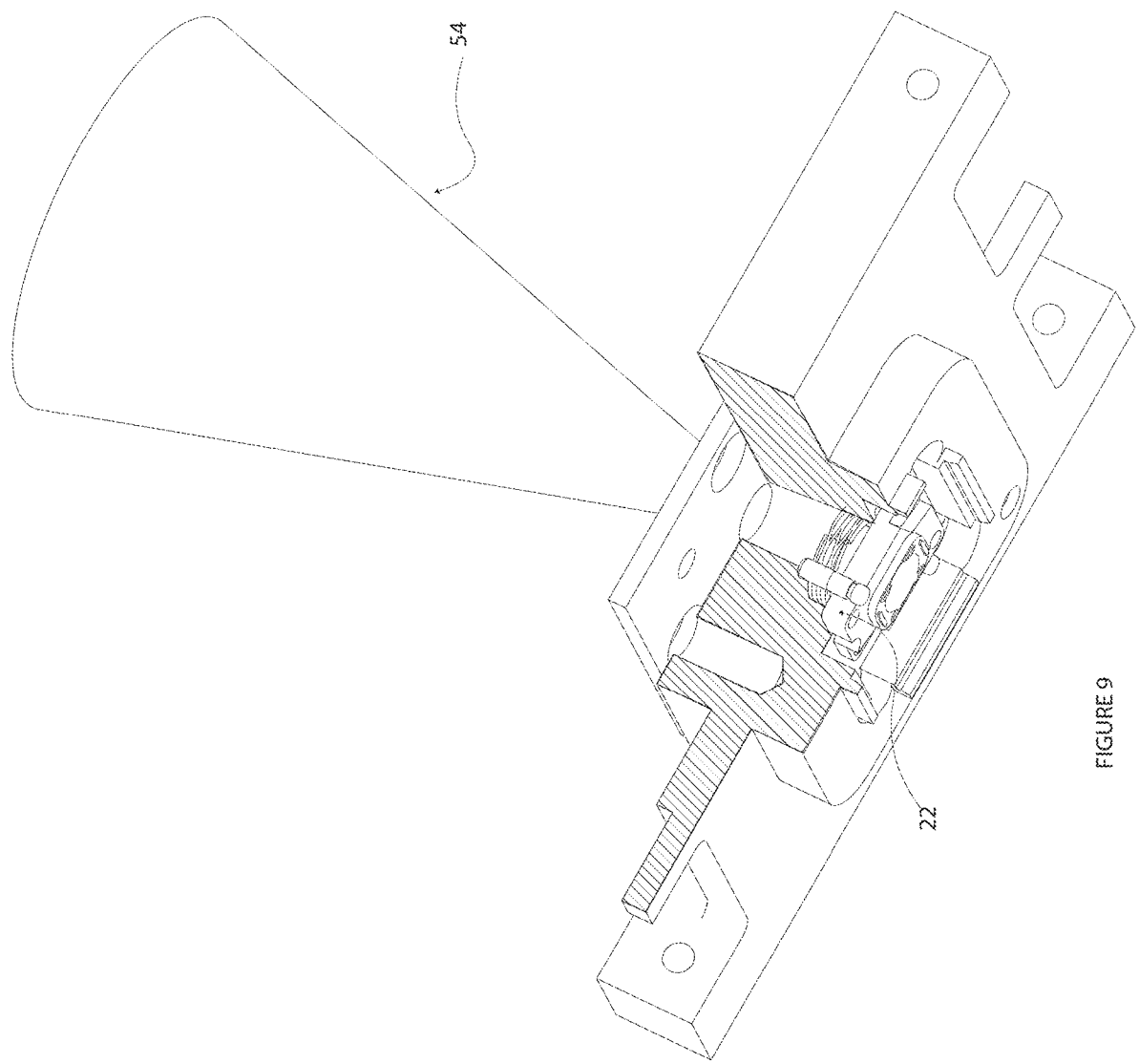
FIG. 9 is a bottom perspective view of the subject matter of FIG. 6.
Figure 10:
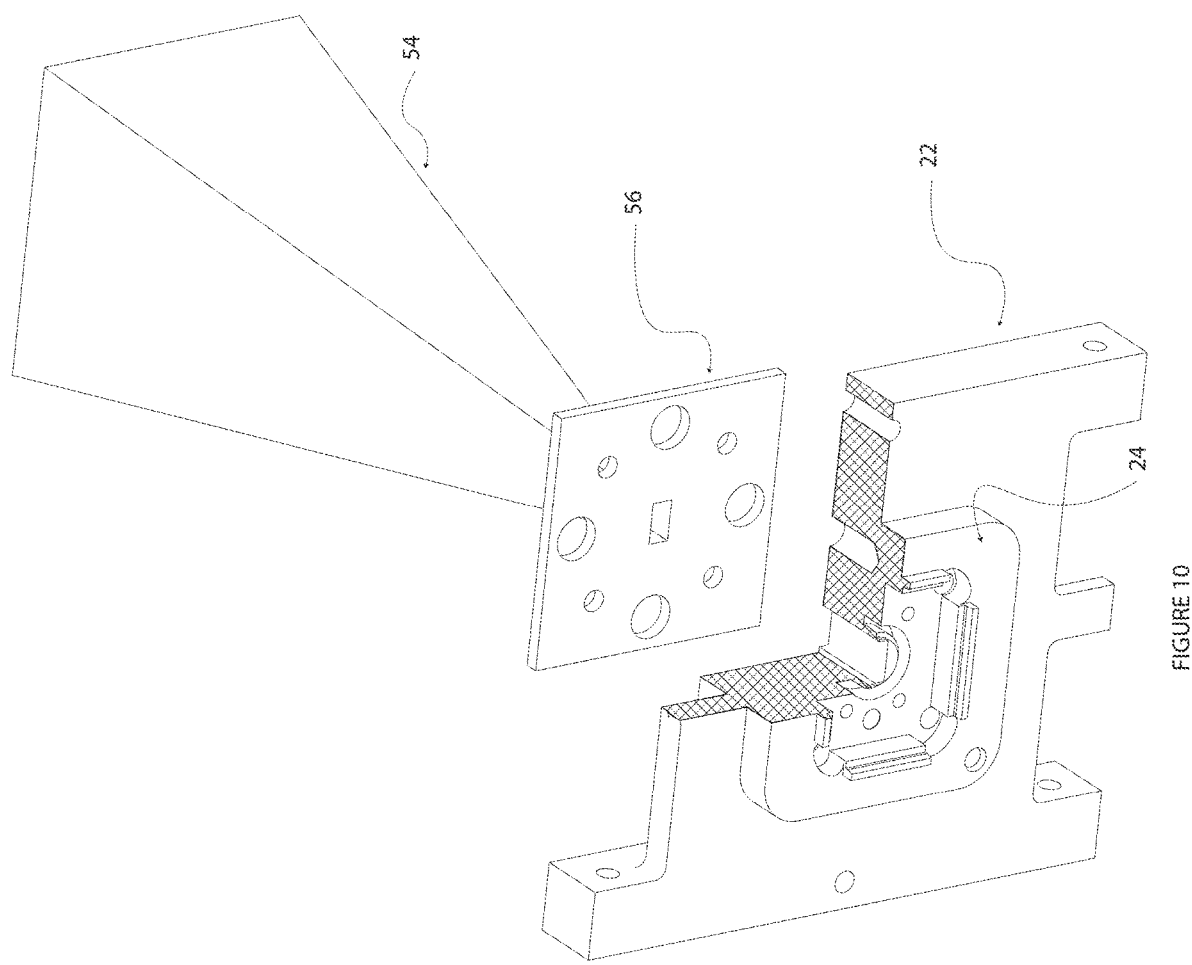
FIG. 10 is a view like FIG. 9 but exploded.

FIGS. 9 and 10 show a similar construction with a conical horn 54 with a proximal aperture near the DUT sized to be equal to or larger than the DUT RF port and at its distal end a larger opening.

Figure 11:
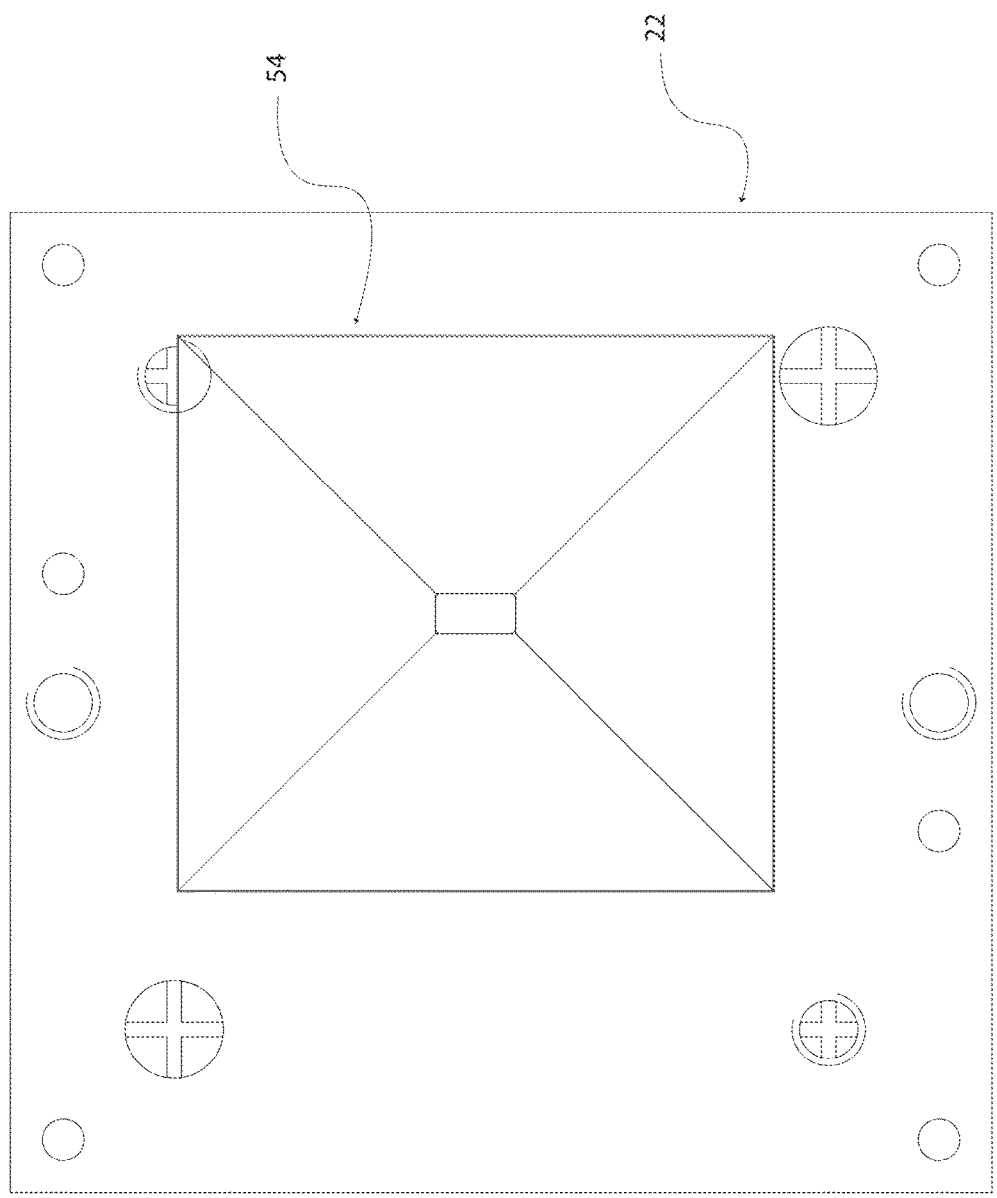
FIG. 11 is a top plan view of a rectangular waveguide.

FIG. 11 is a top view of the rectangular horn 54 where the proximal and distal openings can be seen.

Figure 12:
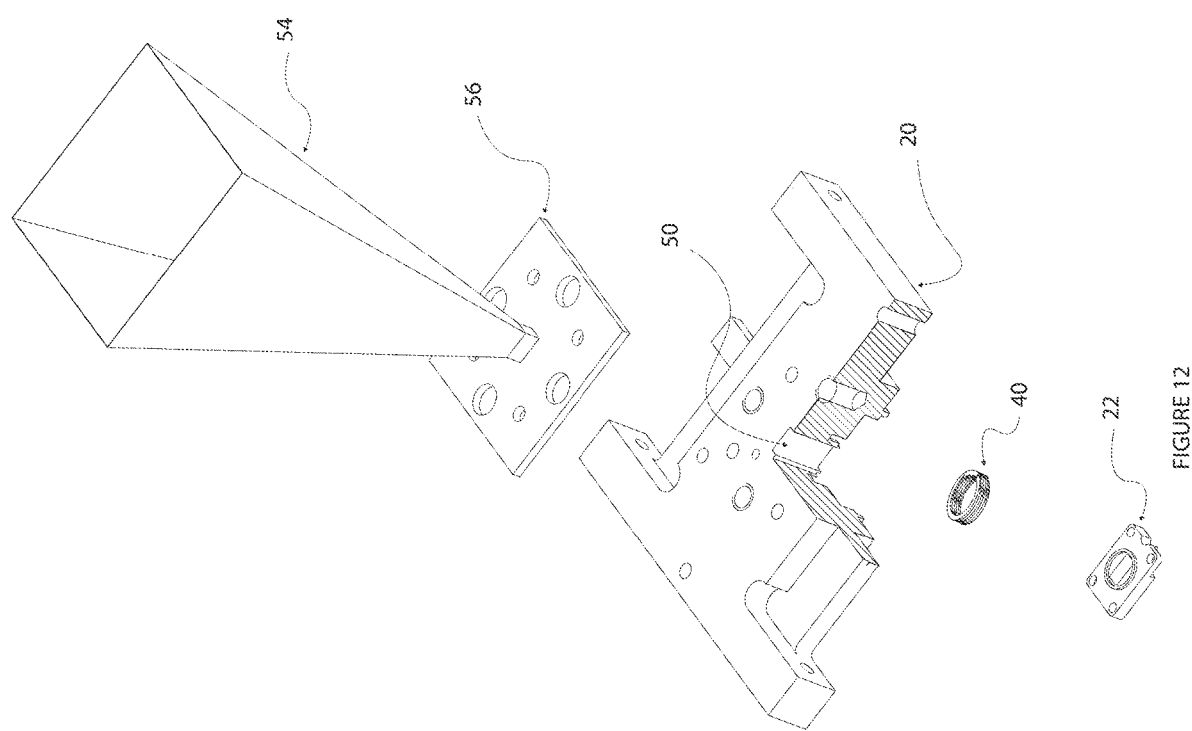
Figure 13:
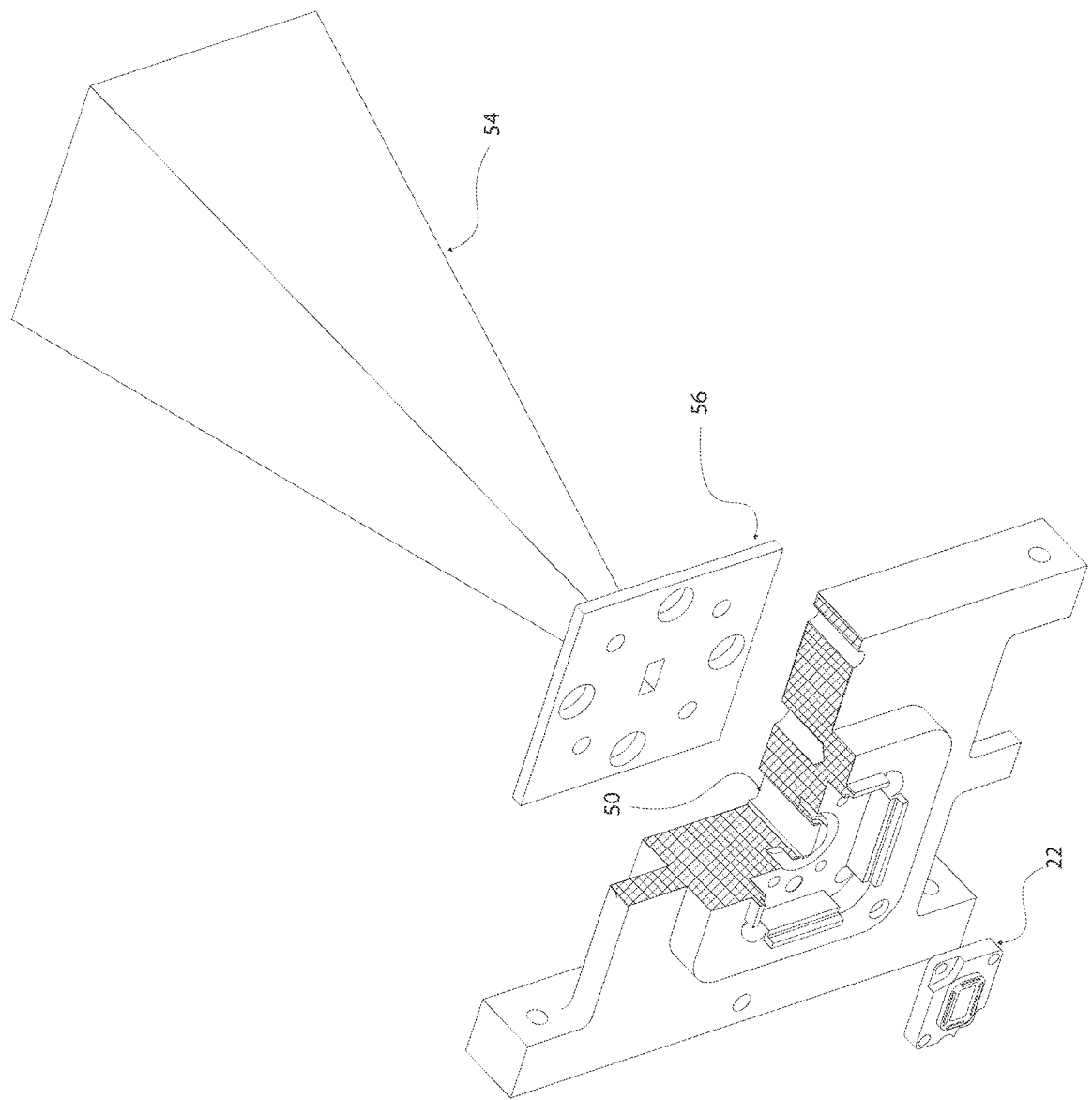
FIG. 13 is a bottom exploded view of FIG. 12.
Figure 14:
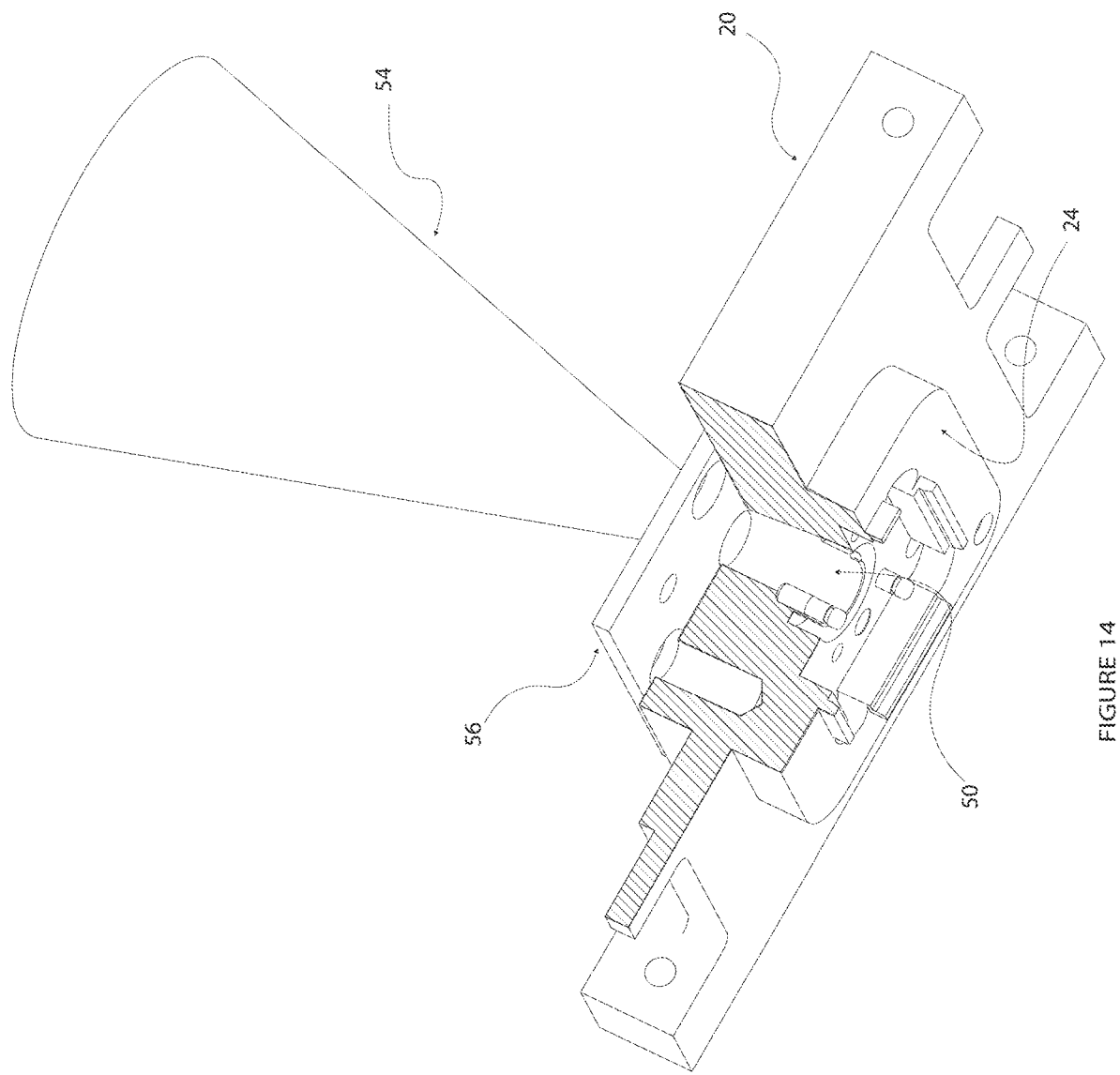
FIG. 14 is a view like FIG. 12 but not exploded.
Figure 15:
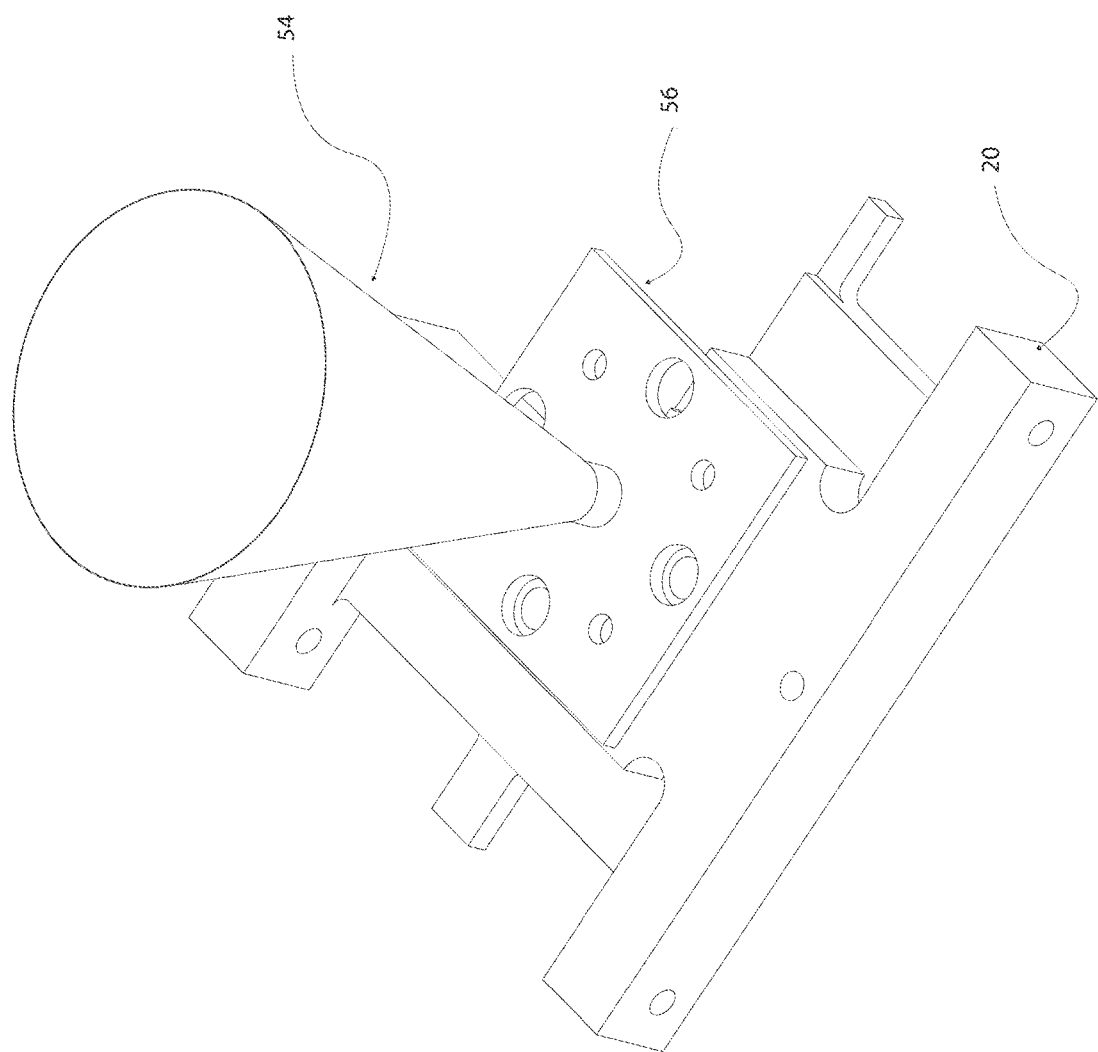
FIG. 15 is a top perspective view of FIG. 14.

FIG. 12 shows the connecting aperture 50 which is coaxial with the waveguide insert passage and the horn.

The waveguide insert/adapter provides a close fit to the DUT RF port and to passage 50 so there is minimal leakage or crosstalk. The adapter can be in contact with the RF port on one side and the horn plate 56 on the other and be constructed of an RF shielding material. The adapter 22 can be customized for the DUT so that the entire assembly need not be changed when a DUT has slightly different RF port orientations, locations or dimensions.

FIGS. 18, 19, 20 and 21 show top views of both rectangular and circular (conical) RF antennas.

FIG. 24 illustrates a configuration where the RF horn antenna 54 is coaxially aligned with receiving horn antenna 154. In the preferred embedment, the horns are coaxially aligned along axis 64 which aligns directly with the DUT RF port 62. Horn 154 is then connected to an RF received for testing the signal out of horn 54. FIG. 25 is a similar view for a different horn shape.

Figure 27:
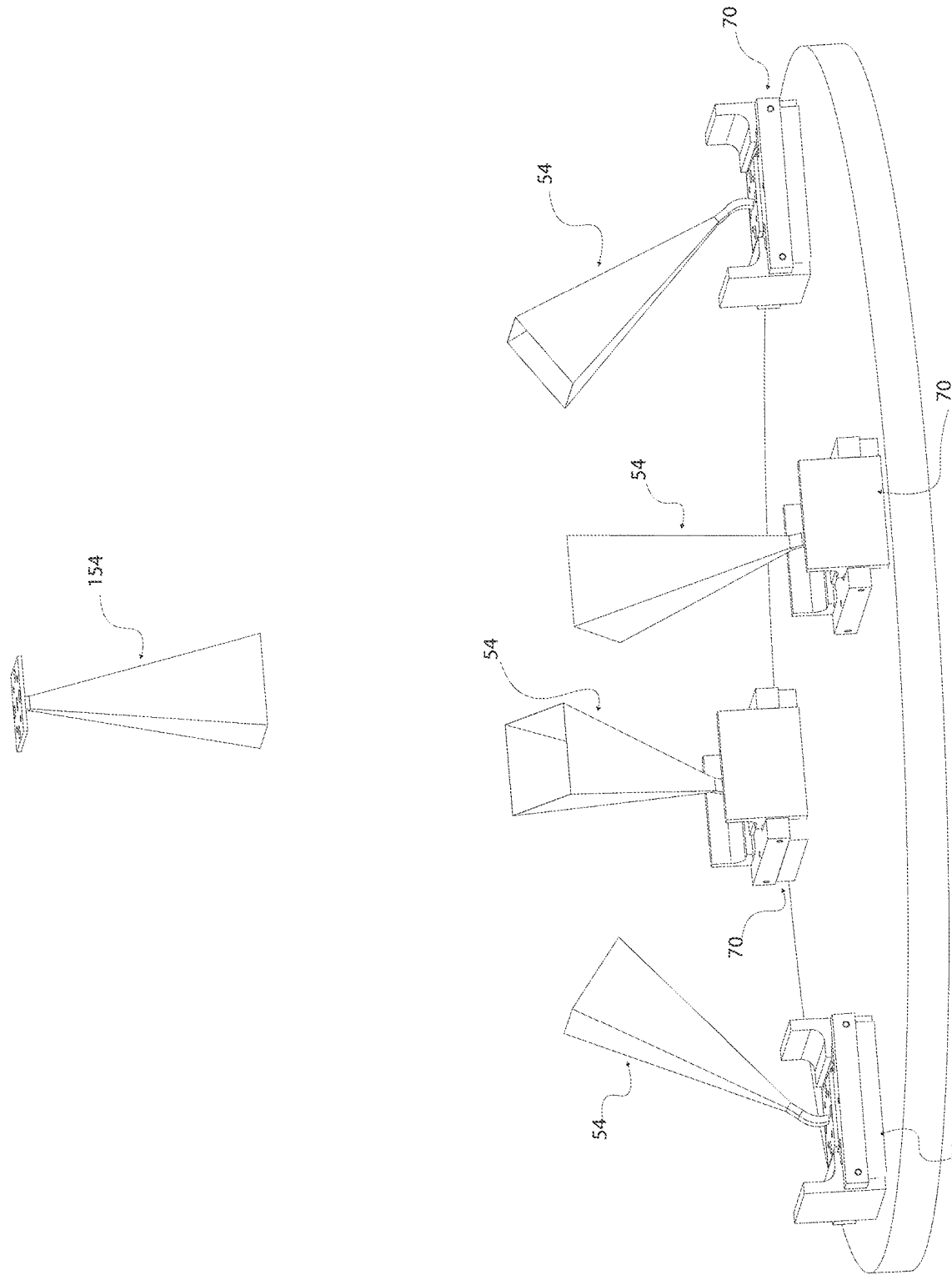
FIG. 27 is a perspective view of an array of housings with waveguides directed to a single receiver waveguide.

FIGS. 27, 28, 29 illustrate how an array of separate DUT tests can be conducted with a single RF receiving horn 154. The array of testing stations 70 are preferably mounting in a circle with the transmitting horn 54 aimed/angled toward receiving horn 154 which is pointed downward. It is also possible to use other configurations such as a single or two opposing spaced apart lines of transmitting horns all pointed toward the receiving horn. Multiple receiving horns are also possible. By sequencing which testing station 70 is active, the receiving horn connected to test equipment (not shown) can associate the test result with the appropriate station. This will reduce the cost of test equipment and the size of the testing array. At least one receiving antenna generally along the central axis spaced from said transmitting antenna. The transmitting antenna may include a plurality of transmitting antennas, one associated with each DUT and wherein each transmitting antenna is pointed to a receiving antenna. The receiving antenna(s) may sequentially test a plurality of DUTs by electronic switching each of the DUTs on an off in any sequence and recording the associated DUT for test data purposes. By this method, multiple RF DUTs can be tested sequentially after inserter of the DUTs in their test housings. The transmitting antennas can each be angled toward the receiving antenna.

This disclosure is for packages that have I/O either on top of package or on both top and bottom of package.

Figure 1:
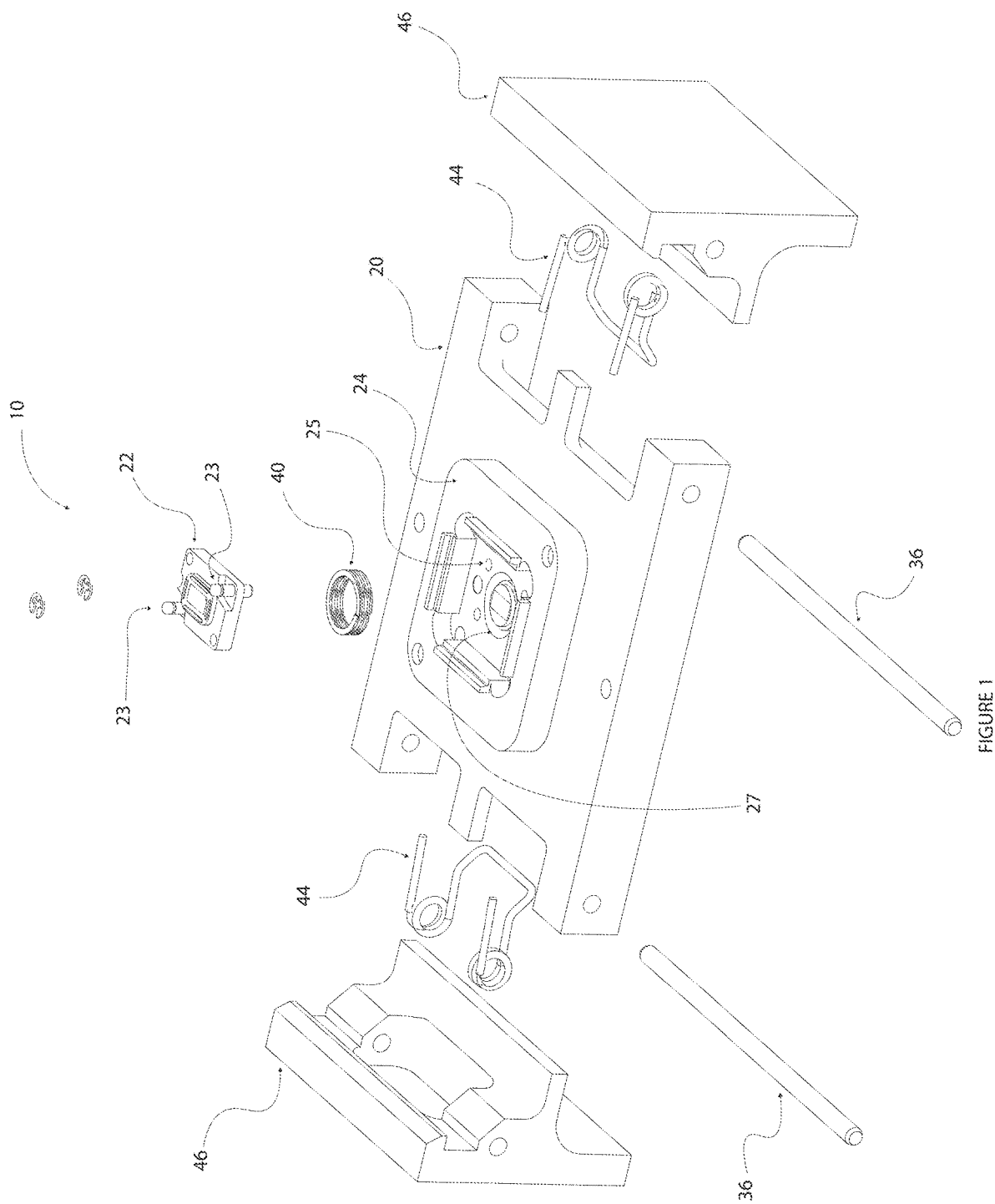
FIG. 1 is a top perspective exploded view of a manual actuator with a compliant housing.
Figure 2:
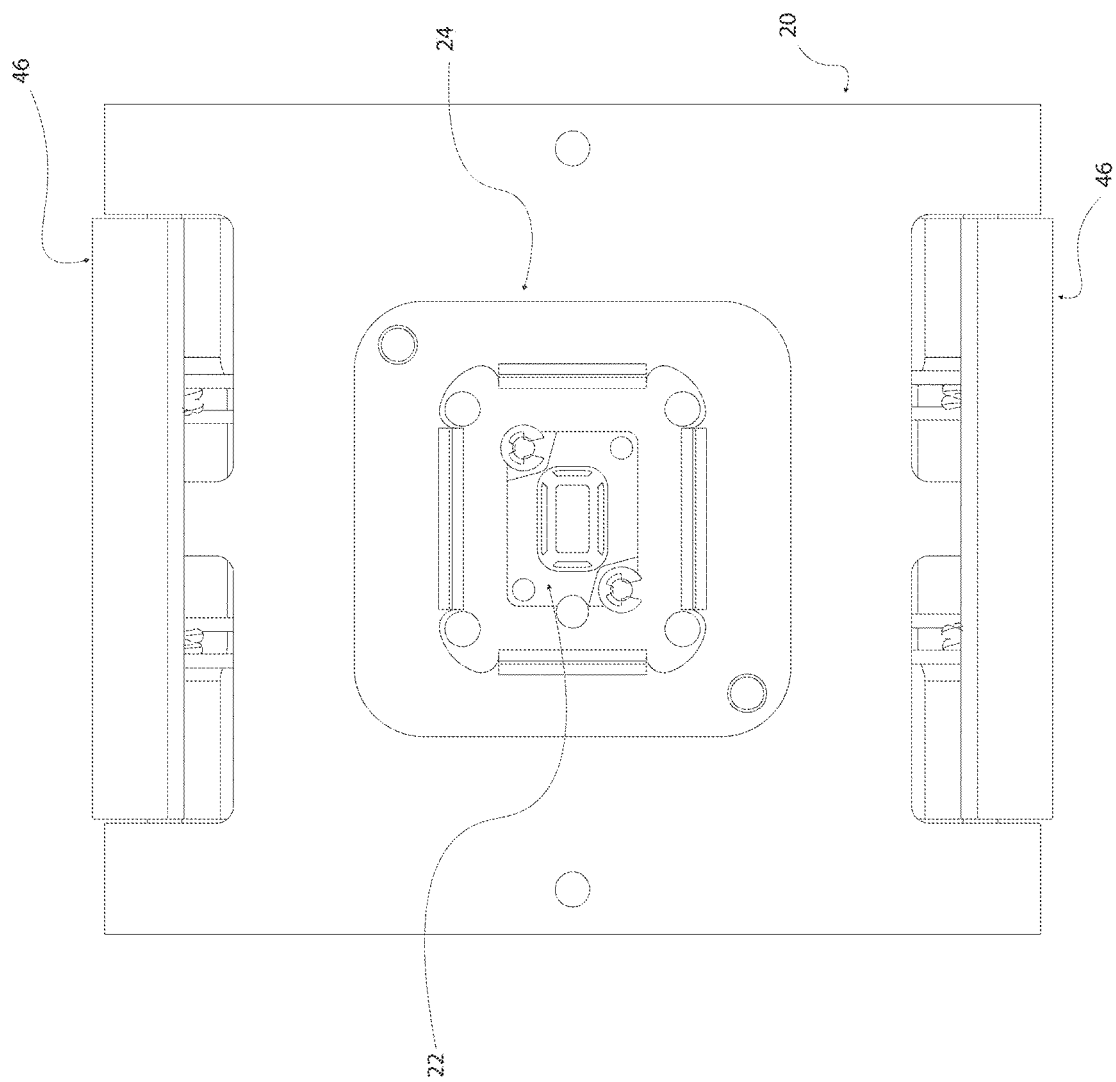
FIG. 2 is a top plan view of FIG. 1.
Figure 3:
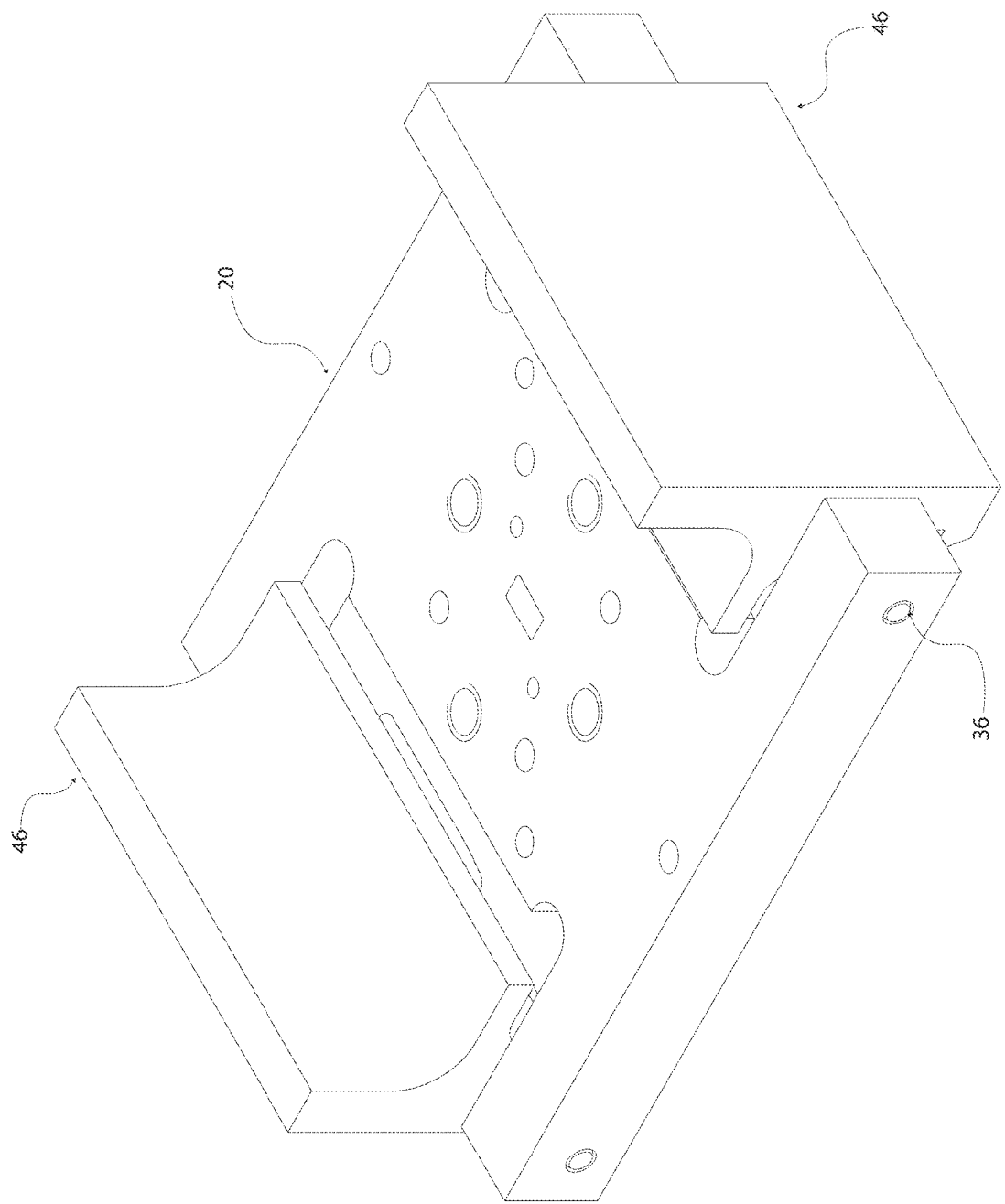
FIG. 3 is a perspective view of the manual actuator with levers.
Figure 4:
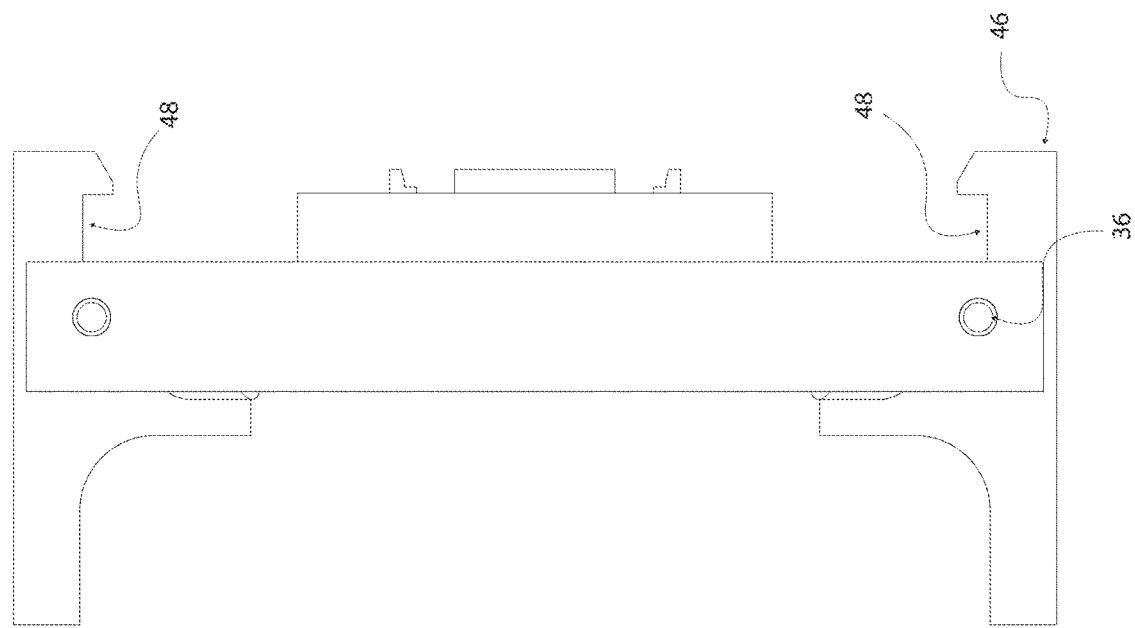
FIG. 4 a side plan view of FIG. 3.
Figure 5:
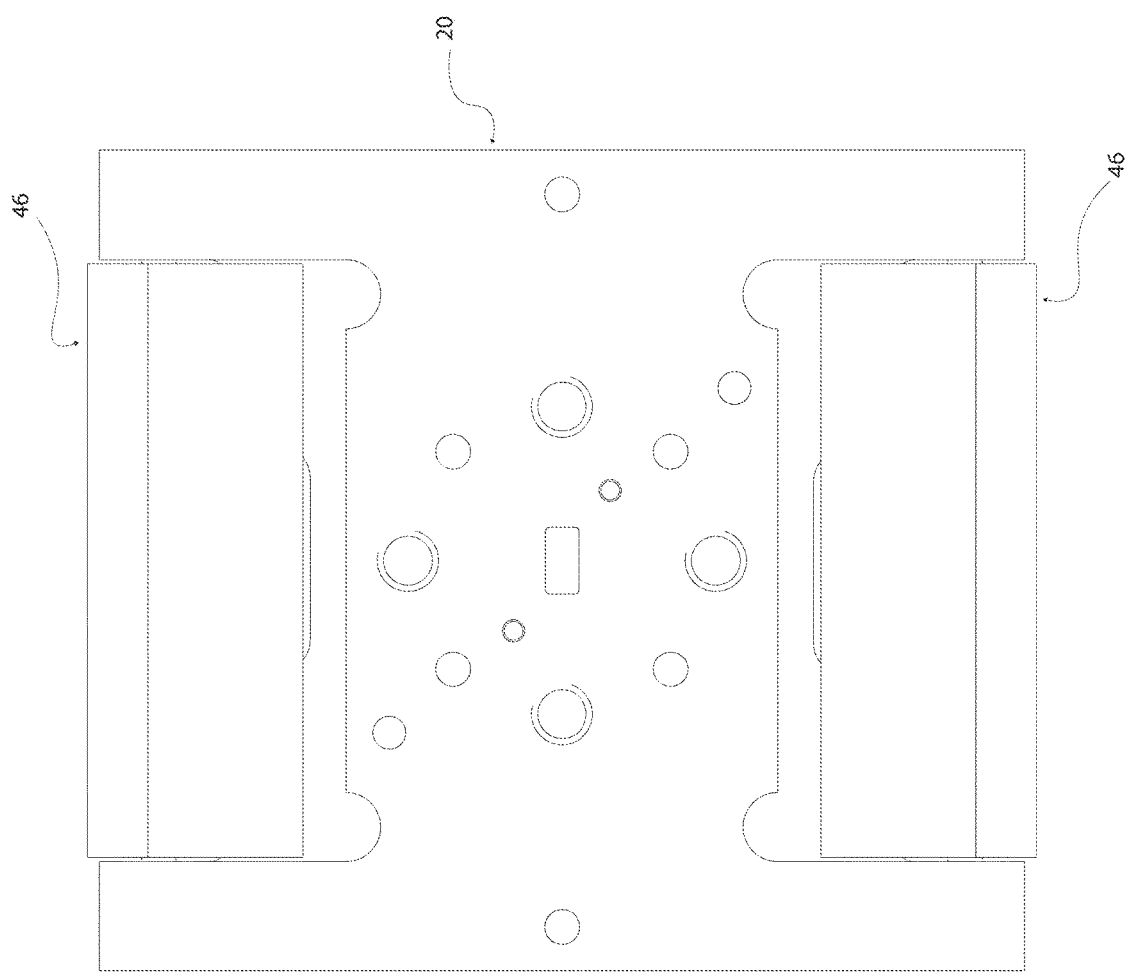
FIG. 5 is bottom view of FIG. 3.

FIG. 1 shows an interconnection with the device under test that has a waveguide opening on top. This opening could be rectangular or could have a circular opening. The compliant waveguide portion that would interface to a waveguide piece/flange and provide some compliance to mating output of device.

In manual test, the device would be inserted into the contactor and manual actuator with built in compliant waveguide would be attached over device using aligning features on manual actuator part to align device waveguide opening to waveguide portion of manual actuator.

In automation mode the manual actuator would be moved aside so device could be placed into contactor and the manual actuator would be moved into place either laterally, vertically or combination of laterally and vertically to align device opening.

This could be done using motor, track or robotic feature. This is important as manually screwing antenna onto manual actuator will degrade that interface causing expensive waveguide pieces to have to be replaced.

In production, the goal is to start test as fast as possible after the device is inserted into the contactor. The waveguide band or opening could be converted to microstrip, coaxial, or use a horn antenna as shown.

Using a horn antenna or running microstrip, coplanar waveguide or coaxial output to antenna would allow test signal to be propagated thru area removing the need for signal to be routed from device to another spot on tester thru a hard connection.

The antenna could be mechanically or electrically pointed in any direction to ease in measurements and sending signal from DUT to tester. Because high frequency signals can propagate thru glass or other materials in the handler It would be a very convenient way to transmit data from within an environmentally (temperature, humidity, pressure, etc) controlled test chamber (enclosure) to test r on outside by using a directional antenna.

Also a switch in waveguide or measurement system on test side could rout signals to just one analyzer for measurements from multiple sites inside production handler to reduce test system costs.

The horn antennas could be made from a plated plastic or other compound using an additive (3D Printing) or subtractive process (machining). Variances in these parts could be calibrated out of system if the antennas could be precisely located during testing.

The antenna on manual actuator side could be calibrated with antenna on receiver side to calibrate any losses between the two antennas.

To make the system operate best the antennas need to be precisely located to provide robustness of the measurement system.

The compliant waveguide section of the manual actuator provides alignment to waveguide opening of device either through precisely aligning package edge or using some feature on device such as a hole or bump that is precisely aligned to waveguide opening.

The horn antennas can be designed to be very directional and as small or large as necessary to adequately and reliably transmit RF power from device opening into waveguide horn at receiver.

If other I/Os are on top of device the I/O could be contacted using standard contacts in contactor and routed to board system similar to method currently being used.

Once established and calibrated the distance between antennas on manual actuator and receiver should be the same distance apart for all testing. Using point to point antenna methods the higher frequency signal can be sent directly to antenna on tester without need for expensive interconnects.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A system for testing multiple integrated circuit devices under test (DUT) having a radio high frequency (RF) wave port located on the DUT, comprising:
   a. an array of test housings each having a receiver for a DUT, said housing being arranged around a central axis;
   b. each housing being associated with a RF transmitting horn antenna having narrow proximal central aperture and a wide distal aperture and defining a transmitter horn axis therebetween;
   c. an interface adapter element having a first end located proximate said DUT RF wave port and a second end;
   d. a receiving RF horn antenna located generally above said array, adjacent said second end of said interface adapter and proximate said central axis;
   e. said RF transmitting horn antennas being oriented so that the horn axis generally points to said receiving horn where the transmitting axis intersects said central axis.

2. The system of claim 1 wherein said DUT has a RF port having a port central axis and wherein said central aperture on said horn antenna is coaxially aligned with said port central axis.

3. The system of claim 1 further including a waveguide insert supported by a compliant elastic member, said insert being interposed between said DUT RF port and said horn antenna which thereby causes the insert to minimize RF leakage between the DUT RF port and antenna.

4. The system of claim 3 wherein said elastic member is at least partially recessed with said housing.

5. The system of claim 4 wherein said housing includes a groove sized to receive a portion of said elastic member.

6. The system of claim 1 wherein said DUT, housing and transmitting antenna are enclosed in an environmentally controlled enclosure.

7. The system of claim 6 further including at least one receiving antenna and wherein said receiving antenna is located outside said enclosure.

8. The system of claim 1 further including at least one receiving antenna and wherein said receiving antenna is located generally along said central axis spaced from said transmitting antenna.

9. The system of claim 8 wherein said transmitting antenna includes a plurality of transmitting antennas, one associated with each DUT and wherein each transmitting antenna is pointed to said receiving antenna.

10. The system of claim 9 wherein said receiving antenna sequentially tests a plurality of DUTs.

11. The system of claim 9 wherein said transmitting antennas are each angled toward said receiving antenna.

12. The system of claim 1 wherein said interface adapter is biased against said RF port.

13. The system of claim 1 wherein said interface adapter includes vertical pints and is configured to move along said pins.

14. A test apparatus for testing multiple integrated circuit devices under test (DUT) having a radio high frequency (RF) wave port located on the DUT, comprising:
   f. an array of test housings each having a receiver for a DUT, said housing being arranged around a central axis;
   g. each housing being associated with a RF transmitting horn antenna having proximal central aperture and a wider distal aperture and defining a transmitter horn axis therebetween;
   h. a circumferential adapter element size to surround said DUT RF port having a first end located proximate said RF wave port and having a bias element to maintain engagement between said RF port and said adapter;
   i. a receiving RF horn antenna located generally above said array and proximate said central axis and said adapter;
   j. said RF transmitting horn antennas being oriented so that the horn axis generally points to said receiving horn where the transmitting axis intersects said central axis.

15. A method of testing a plurality of radio frequency transmitting devices under test (DUT), each DUT having a RF output port, comprising the steps of:
   a. locating a plurality of DUTs in an array with each RF output port being oriented in the same direction;
   b. locating a transmitting RF waveguide horn proximate the DUT output port on DUT;
   c. locating a receiving wave guide horn proximate the array but spaced therefrom and generally central to the array;
   d. pointing the transmitting RF waveguide horns in the array at an angle toward the receiving horn;
   e. sequentially testing each of DUTs in the array and sequentially receiving RF signals from each of said DUTs at said receiving horn.

16. The method of claim 15 further including the step of pointing each of said horns toward said receiving horn.

17. The method of claim 15 further including locating an adapter element between said RF port and said RF waveguide to create an RF shield therebetween.

18. The method of claim 17 further including locating an elastomeric bias member adjacent the adapter element to maintain said element in contact with said RF waveguide and minimize RF crosstalk.

19. The method of claim 15 further including the step of locating the DUT and wave guide horn within an environmentally enclosed chamber and locating said receiving horn outside said chamber.

* * * * *